United States Patent [19]

Brun et al.

[11] 4,208,741
[45] Jun. 17, 1980

[54] AFC SYSTEM FOR A SYNTHESIZER TUNING SYSTEM

[75] Inventors: Craig W. Brun, Honeoye Falls; Wilfred L. Hand, Clarence, both of N.Y.

[73] Assignee: GTE Products Corporation, Stamford, Conn.

[21] Appl. No.: 956,955

[22] Filed: Nov. 2, 1978

[51] Int. Cl.² .................... H03B 3/06; H04N 5/50
[52] U.S. Cl. ......................... 455/180; 455/183; 455/192; 358/195.1; 331/47; 331/117 R; 331/158
[58] Field of Search ............... 331/47, 55, 117 R, 158, 331/172, 173; 358/191, 193, 195; 325/418–423, 452, 453

[56] References Cited

U.S. PATENT DOCUMENTS

| | | | |
|---|---|---|---|
| 3,675,146 | 7/1972 | Langham | 331/55 X |
| 3,764,916 | 10/1973 | Merrell | 358/191 X |
| 3,949,158 | 4/1976 | Rzeszewski et al. | 358/195 |
| 4,128,849 | 12/1978 | Rhee | 358/195 X |

Primary Examiner—James W. Moffitt
Assistant Examiner—Aristotelis M. Psitos
Attorney, Agent, or Firm—John A. Odozynski

[57] ABSTRACT

A voltage-controllable reference oscillator for a synthesized receiver. In one mode of operation the reference oscillator is injection locked to a crystal-controlled oscillator so that the receiver's local oscillator frequency is a rational multiple of the crystal oscillator frequency. In another mode of operation the reference oscillator is isolated from the crystal-controlled oscillator and its operating frequency is determined by the voltage applied at its tuning control terminal. The control voltage is selectively provided by a manually variable fine tuning circuit or by an AFC circuit. An acquisition delay circuit develops a pulse when a channel is selected or when the source of tuning voltage is changed, thereby assuring that the reference oscillator is operating in the injection-locked mode until the synthesizer phase-locked loop has achieved acquisition.

16 Claims, 1 Drawing Figure

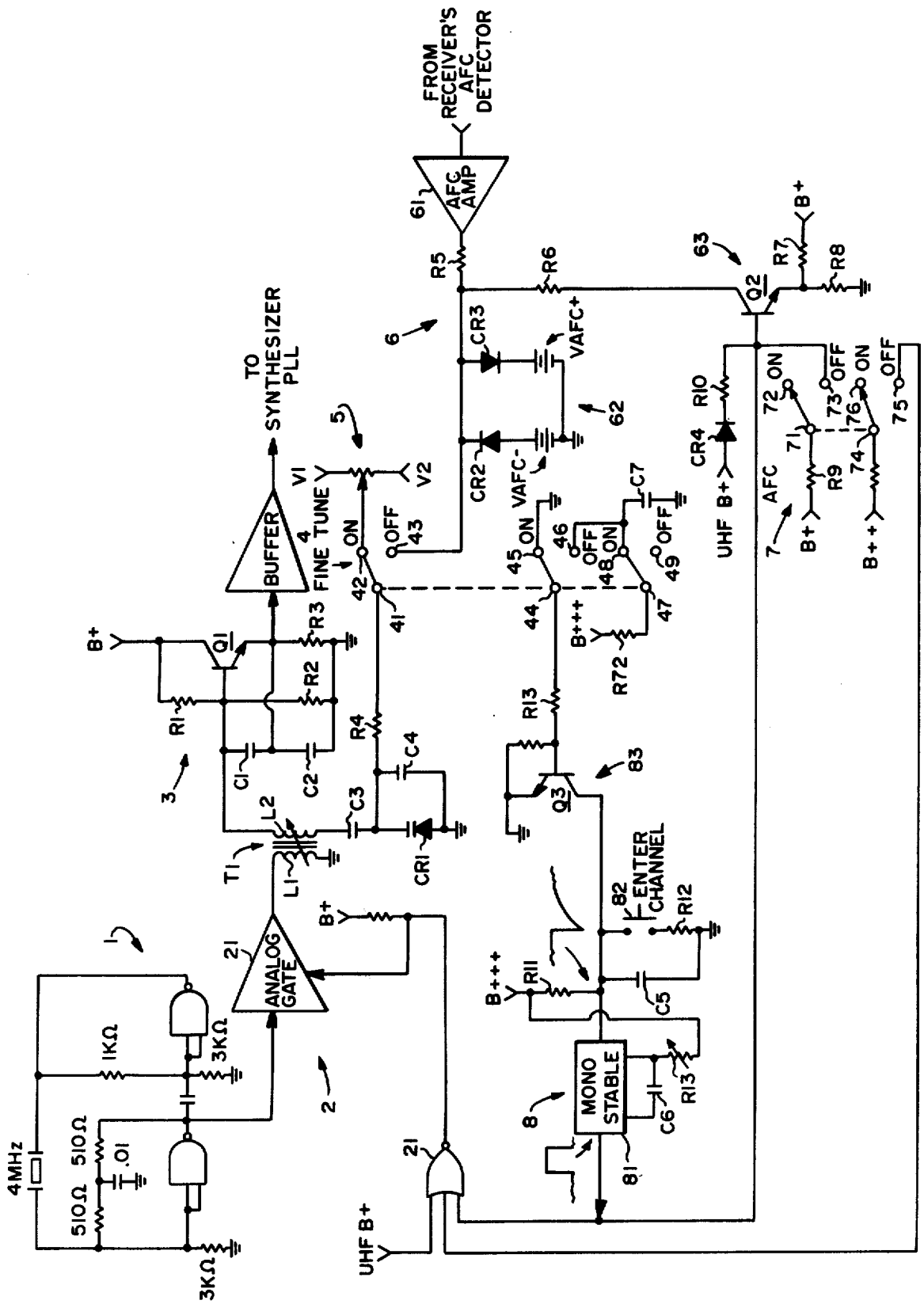

AFC SYSTEM FOR A SYNTHESIZER TUNING SYSTEM

CROSS-REFERENCE TO RELATED APPLICATION

Cross-reference is made to the related application "Acquisition Delay Circuit For A PLL Reference Oscillator," Ser. No. 956,954, filed on the same date and assigned to the same assignee as this application.

FIELD OF THE INVENTION

This invention relates to synthesized receivers and more particularly to a reference oscillator that is selectively injection locked to a crystal oscillator or controlled by a voltage applied to its tuning control terminal.

BACKGROUND OF THE INVENTION

It has been found expedient in the design of many state-of-the-art television receivers to utilize frequency synthesis techniques in the generation of the tuner's local oscillator signal. In particular, in a Phase-Locked Loop (PLL) synthesizer, a very stable, usually crystal-controlled reference signal is phase/frequency compared with the signal developed by a voltage-controlled oscillator (VCO). The voltage output of the comparator is appropriately filtered and coupled to the VCO so that its output frequency is locked and substantially equal to the operating frequency of the reference oscillator. In general the reference oscillator signal is divided by a fixed divider and the output of the VCO is divided by a variable divider, according to the desired frequency of operation, so as to supply the desired frequencies to the phase/frequency comparator. In a particular synthesizer system used in conjunction with the subject invention, a 4 MHz crystal-controlled reference oscillator is divided by a factor of 512 to produce a fixed reference frequency of 7.8125 KHz at one input of the phase/frequency comparator. The local oscillator frequency, at 45.75 MHz above the nominal picture carrier frequency for a given channel, is then divided by an appropriate factor to produce a signal of the same nominal frequency at the other input of the comparator. For example, the Channel 2 picture carrier is at 55.25 MHz and the receiver's local oscillator should be at 101 MHz. The appropriate divider factor is then 101 MHz/7.8125 KHz, or 12928. This factor can be implemented by a fixed divider at 64 followed by a variable divider set at 202. In a properly operating PLL synthesizer, any error in the receiver's local oscillator frequency will result in an output that will tend to equalize the frequencies of the signals at the input to the phase/frequency comparator, thereby correcting the local oscillator frequency.

It is clear that the system described above is satisfactory when the receiver is receiving signals whose picture carrier is at the frequency specified by the FCC for a given channel. In this situation the PLL operation will assure the desired local oscillator frequency and the picture and sound carriers will be substantially exactly converted to the standard IF frequencies, 45.75 MHz and 41.25 MHz respectively. However, when the television receiver is operating from sources, such as some CATV and MATV systems, that provide nonstandard carrier signal frequencies, the preprogrammed divider ratios described above will result in the conversion of the carrier signals to frequencies other than 45.75 and 41.25 MHz. In some cases the deviation from the specified standard frequencies may be as much as ±1 MHz. Those familiar with the design and operation of television receiver circuitry are aware that, because of the frequency selectivity of the receiver's signal processing circuitry, a significant deterioration of both picture and sound quality will likely result.

Prior art circuits that have indicated an awareness of and attempt to confront the above anomolies have not been entirely successful. For example, systems that switch from a crystal-controlled reference oscillator to some other, say, voltage-controllable reference when receiving a nonstandard signal, tend to lose tuning when the carrier signal is lost during the transition from crystal-controlled to voltage controlled reference oscillator operation. The momentary loss of tuning may be so significant so as to preclude subsequent reacquisition, thereby rendering the dual reference oscillator system fatally ineffective.

OBJECTS OF THE INVENTION

It is an object of this invention to provide a reference oscillator for a synthesizer-derived signal source.

It is a further object of this invention that the reference oscillator be capable of highly stable, for example, crystal-controlled operation.

It is a further object of this invention that the reference oscillator be capable of providing a continuously variable output frequency so as to accomodate deviations in the received signal frequency from standard specified frequencies.

To this end, it is a further object of this invention that the reference oscillator be capable of switching from a crystal-controlled mode of operation to a voltage-controlled mode of operation.

It is a further object of this invention that the synthesizer PLL maintain acquisition or rapidly obtain reacquisition when the reference oscillator is switched between modes of operation.

SUMMARY OF THE INVENTION

The above and other objects and advantages are achieved in one aspect of this invention by a reference oscillator for a frequency synthesizer. The reference oscillator comprises a crystal-controlled oscillator and a voltage-controllable oscillator selectively coupled to the crystal-controlled oscillator. The natural frequency of operation of the voltage-controllable oscillator is determined by the voltage applied to its voltage control terminal. This terminal is coupled to the pole of a switch that has one terminal coupled to a fine tuning circuit and another terminal coupled to an AFC control circuit. Another control circuit coupled between the crystal-controlled oscillator and the voltage-controllable oscillator is driven by a second switch which has conditions corresponding to AFC or AFC OFF conditions. When this switch is in the AFC OFF condition the voltage-controllable oscillator is injection locked to the crystal-controlled oscillator. When the switch is in the AFC ON condition, the operating frequency of the reference oscillator is determined by the voltage applied to the voltage control terminal of the voltage-controllable oscillator.

DESCRIPTION OF THE PREFERRED EMBODIMENT

For a better understanding of the present invention, together with other and further objects, advantages and capabilities thereof, reference is made to the following disclosure and appended claims in connection with the above description of some of the aspects of the invention.

As illustrated in FIG. 1, the 4 MHz output of the crystal-controlled oscillator 1 is coupled to the input of an analog gate 2. The crystal-controlled oscillator may be constructed from a pair of dual-input NAND gates, for example, a standard integrated circuit type SN7400 or equivalent, and external components, including an appropriate 4 MHz crystal, as shown. The analog gate may be in one of many forms but will have an enabling input at which will be applied a voltage of a particular logic level. When a logic ZERO level appears at the enabling input, the gate is enabled; that is, the crystal oscillator output is coupled to the primary winding L1 of transformer T1. Conversely, when a logic ONE level appears at the enabling input, the gate will be disabled; that is, T1 and its associated circuitry will be isolated from the crystal-controlled oscillator. In a manner to be described in detail below, the voltage at the analog gate enabling input is determined by a control circuit 20 comprising a multiple-input NOR gate 21. The output of the NOR gate is coupled through a resistor to a source of voltage, B+. When any of the inputs to the NOR gate is a logic ONE level, its output will be pulled to ground, the analog gate will be enabled, and the 4 MHz output of the crystal-controlled oscillator will appear across the primary winding of T1. Conversely, when all the inputs to the NOR gate are at a logic ZERO level, the output of the NOR gate will be at a logic ONE level, the analog gate will be disabled, and T1 and its associated circuitry will be isolated from output of the crystal-controlled oscillator.

The secondary of T1 includes an inductance L2 of the voltage-controllable oscillator 3. The voltage-controllable oscillator comprises a transistor Q1 which has collector connected B+ and a base coupled through bias resistors R1 and R2 to B+ and ground, respectively. The emitter Q1 is coupled through a resistor R3 to ground. The necessary feedback signal is applied from the emitter to the base of Q1 via capacitors C1 and C2, respectively coupled from the base to emitter of Q1 and from the emitter of Q1 to ground. The oscillator tank circuit is comprised of, in addition to C1 and C2, L2 which is connected at one end to the base of Q1 and coupled at the other through coupling capacitor C3 to a voltage-controlled capacitance, varactor diode CR1. CR1 has a cathode coupled to C3 and an anode connected to ground. A capacitor, C4, is connected in parallel to CR1 so that its capacitance adds to that of CR1, thereby forming a tuned circuit with L2 and establishing the oscillator's natural frequency of oscillation. The output of the oscillator is coupled to a buffer amplifier and therefrom, after the prescribed frequency division, to the reference input of synthesizer phase/frequency comparator.

In the absence of a 4 MHz signal from the crystal-controlled oscillator, the frequency of oscillator 3 will be established by the voltage across diode CR1. The cathode of CR1 is coupled through a resistor R4 to a tuning voltage control terminal, a first pole 41 of voltage applying means in the form of the FINE TUNE switch 4. (Although switch 4 is represented in a conventional mechanical form, it will be obvious that other switching apparatus, either mechanical or electrical, may be used without departing from the scope of this invention.) When the FINE TUNE switch is in the ON position, the pole 41 is connected to a terminal 42 which is in turn connected to a fine tuning circuit 5. The fine tuning circuit comprises, at least, a manually controllable variable resistor connected between first and second voltage references, V1 and V2. In the FINE TUNE ON condition the nominal voltage across CR1 is approximately 10 volts. With L2 equal to 6.5 μh and values of C1, C2 and C4 equal to 3300 pf, 1500 pf, and 270 pf respectively, oscillator 3 operates at a natural frequency of approximately 4 MHz. As the wiper of the variable resistor is manually adjusted between V1 and V2, the voltage across CR1 and the operating frequency of oscillator 3 will vary accordingly.

With the FINE TUNE switch in the OFF condition, that is, pole 41 connected to terminal 43, the voltage across CR1 is established by an AFC control circuit 6. In this mode of operation the tuner's local oscillator will be locked onto the frequency of the voltage-controllable reference oscillator. Any deviation of the voltage-controllable oscillator from its nominal value of 4 MHz will result in the conversion of the desired channel picture carrier to a frequency other than 45.75 MHz. The receiver's AFC detector will generate a correction voltage in proportion to the frequency error of the converted picture carrier. This voltage will be processed by the AFC control circuit 6 so as to correct the reference oscillator frequency.

Circuit 6 comprises an amplifier 61 having an input coupled to the receiver's AFC detector and an output coupled through a resistor R5 to the FINE TUNE OFF terminal 43 associated with pole 41. Using an RCA integrated circuit AFC detector, part of device CA3136, the input to the AFC amplifier will vary within the nominal range of 1 to 5 volts and its output will vary within the range of approximately 12 to 8 volts.

In order to limit the voltage developed at terminal 43, and hence the receiver's AFC pull-in range, circuit 62 is connected between the output of the AFC amplifier and circuit ground. This circuit operates to restrict the output of the AFC amplifier between the upper and lower limits determined by the reference voltages VAFC+ and VAFC−. Circuit 62 comprises a first diode, CR3, poled in one direction, that is, anode coupled to the AFC amplifier and cathode to VAFC+, and a second diode, CR2, poled in the opposite direction, that is, cathode coupled to the AFC amplifier and anode TO VAFC−. As the output of the AFC amplifier goes above VAFC+, CR3 will become forward-biased and the voltage at terminal 43 will be held at approximately VAFC+. Conversely, as the output of the AFC amplifier goes below VAFC−, CR2 will become forward-biased and the voltage at terminal 43 will be held at approximately VAFC−. The effect will be to limit the AFC pull-in range and insure against false locking onto spurious carrier signals such as the associated sound carrier, at 41.25 MHz, and the adjacent sound carrier, at 47.25 MHz.

In some modes of operation, it will be desirable to have the AFC voltage clamped at its nominal value, 10 volts. This is accomplished by a clamping circuit 63 comprising clamping means in the form of transistor Q2 having a collector terminal coupled through a resistor R6 to the output of the AFC amplifier and emitter terminal coupled to a clamping reference voltage. The clamping reference comprises a resistor R7 connected between B+ and the emitter of Q2 and a resistor R8 connected between the emitter of Q2 and ground. With B+ equal to 28 volts and values for R7 and R8 equal to 1.8K ohms and 1.0K ohms respectively, the voltage at the emitter of Q2 will be approximately 10 volts. When a logic ONE level appears at the input (base) of Q2, Q2 will become saturated and the voltage at terminal 43 will be clamped at approximately 10 volts, regardless of the operation of the AFC amplifier. The clamp will be operative, that is, close-circuited, when an AFC switch 7 is in its OFF condition; that is, when its pole 71 is connected to terminal 73. In this condition the base of Q2 will be coupled through R9 to B+. When the AFC switch is in the ON position, pole 71 connected to terminal 72, terminal 73 will be open-circuited but the clamp may be rendered operative by one of two other operating conditions described below. (As with the FINE TUNE switch, the AFC switch has been represented in conventional mechanical form. It may, however, assume other known configurations without departing from the scope of this invention.)

The operation of the reference oscillator described above is as follows. With the AFC switch in the OFF position, a logic ONE level will appear at the AFC input of gate 21. The logic ONE level will be coupled from a voltage source B++ to a pole 74 of the AFC switch and therefrom to a terminal 75. Pole 74 is connected to terminal 75 when the AFC switch is in the OFF condition and to terminal 76 in the ON condition. The analog gate will be enabled and the 4 MHz output of the crystal-controlled output will be coupled by T1 to the voltage-controllable oscillator. With the FINE TUNE switch in the OFF position, the voltage at the cathode of CR1 will be approximately 10 volts and the oscillator's natural operating frequency will be approximately 4 MHz. However, because of the injection of the 4 MHz signal in the voltage-controlled oscillator tank circuit, it will not necessarily operate at its natural frequency but at a frequency almost precisely equal to 4 MHz. The reference input to the VCO will be fixed at the crystal-controlled oscillator frequency, 4 MHz, and the receiver's local oscillator will be locked to one of the pre-programmed carrier frequencies. However, if for the reasons stated above, it is desirable to have the local oscillator operating at a frequency other than one of the pre-programmed frequencies, the AFC switch may be placed in the ON position. Assuming the analog gate 21 is disabled (it may not be for reasons stated below) the reference oscillator will operate at its natural frequency, as determined by the voltage at the cathode of CR1. With the FINE TUNE switch in the OFF position, any deviation in the frequency of the converted picture carrier from its nominal value, 45.75 MHz, will result in error correction voltage at the output of the receiver's AFC detector, thereby correcting the frequency of the reference oscillator and, because the local oscillator frequency is an integer multiple of the reference oscillator frequency, a correction of the local oscillator frequency. With the FINE TUNE switch in the ON position, the reference and local oscillator frequencies may be manually controlled via the fine tuning circuit 5.

Because MATV and CATV systems do not generally distribute UHF signals and the transmitted UHF signals are always on frequency, it may be desirable to have voltage-variable operation of the reference oscillator only on VHF channels. Consequently the analog gate will be enabled and the voltage at terminal 43 will be clamped whenever a UHF channel is selected. Both these functions are accomplished by virtue of a UHF B+ that is 24 volts during operation on a UHF channel and otherwise zero. UHF B+ is coupled to an input of gate 21, thereby enabling the analog gate and injection locking the reference oscillator during UHF reception. UHF B+ is also coupled through a series-connected resistor R10, and diode, CR4, to the base of Q2 so as to clamp the voltage at terminal 43 to approximately 10 volts.

A loop acquisition delay circuit 8, comprising a monostable 81 prevents any discontinuity in the synthesizer reference source and also prevents spurious signals detected by the AFC detector from influencing the synthesizer PLL during loop acquisition. This is accomplished by assuring that the reference oscillator is in the injection-locked mode of operation when the viewer selects a channel via the CHANNEL ENTER pushbutton switch 82 or switches the FINE TUNE switch from the ON to OFF position. The monostable, which may be an integrated circuit type SN 74121 or equivalent, has a trigger input coupled to a trigger network comprising a 470-ohm resistor, R11, and a capacitor, C5. The trigger input is coupled through R11 to B+++ and through a capacitor C5 to ground. The trigger input is also coupled through the CHANNEL ENTER button and a series-connected, 10-ohm, resistor, R12, to ground. A negative-going input pulse at the input to the monostable 81 causes it to generate a positive-going output pulse of a duration determined by capacitor C6 and resistor R13. During steady state operation capacitor C5 is charged through R11 to B+++, approximately 5 volts. When the viewer selects a channel by depressing button 82, C5 is rapidly discharged to ground according to the time-constant established by C5 and R12. For respective values of 0.1 uF and 10 ohms, the discharge time constant is one microsecond. The negative-going voltage at the input device 81 causes a positive-going pulse to appear at its output. This pulse is coupled to an input of gate 21, thereby enabling the analog gate and assuring injection-locked operation of reference oscillator. The output is also coupled to the base of Q2, thereby clamping the voltage at terminal 43 to ten volts. After the monostable pulse duration the reference oscillator returns to the voltage-controlled mode of operation, provided that the AFC switch is in the ON position.

The delay circuit also generates a pulse when the FINE TUNE switch goes from its ON to OFF condition. This is accomplished by the fine tuning pulse generator 83. Pulse generator 83 comprises a transistor Q3 that has a collector coupled to the input of the monostable, an emitter connected to ground and a base coupled through a resistor R13 to a pole 44 of the FINE TUNE switch. When the FINE TUNE switch is in the ON position pole 44 is connected to a terminal 45 which is in turn connected to ground. The FINE TUNE switch has a third pole 47 coupled through a resistor to B+++. When the FINE TUNE switch is in the ON position pole 47 is connected to a terminal 48 which is wired to a terminal 46. These terminals are coupled through a 5.0 uF capacitor C7 to ground. With the FINE TUNE switch in the ON condition both C5 and C7 are charged to approximately B+++. When the FINE TUNE switch is switched to the OFF condition, pole 44 becomes connected to terminals 46 and 48. The charge on C7 will provide base current to Q3 and Q3 will become conductive, thereby rapidly discharging C5 to ground. As before, the negative-going pulse will trigger monostable 81, resulting in an acquisition delay pulse at the input of gate 21 and the base of Q2. After a period of time C7 will be discharged, Q3 will become nonconductive, and C5 will be charged through R11 to B+++. When the FINE TUNE switch is returned to the ON condition C7 will be likewise charged through R72 to B+++. Subsequent switching to the OFF state will again trigger the monostable. It should be noted that some synthesizer systems provide an output signal indicating whether the PLL acquisition has occurred. If such a signal is available, it can be used to trigger the monostable or, alternatively, as an input to the NOR gate and to the base of Q3.

As is apparent from the description above, the subject invention effects a highly stable, yet flexible, reference oscillator for a synthesized tuning system. When processing signals at the standard specific frequencies, the reference oscillator operates in a highly stable, crystal-controlled, injection-locked mode and AFC correction or fine tuning capability will not normally be required. In this mode the local oscillator frequency will be discrete rational multiples of the crystal-controlled oscillator frequency. When processing signals at nonstandard frequencies, the reference oscillator operates in a voltage-controlled mode and its output frequency is continuously variable according to the voltage applied at its tuning voltage control terminal. The tuning voltage may be selectively supplied from a manually variable fine tuning circuit or automatically from an AFC voltage control circuit. The reference oscillator circumvent problems associated with PLL discontinuities that occur when changing channels or switching the source of tuning voltage for the voltage-controllable oscillator.

Nevertheless, while there has been shown and described what are at present considered the preferred embodiments of the invention, it will be obvious to those skilled in the art that various changes and modifications may be made therein without departing from the scope of the invention as defined by the appended claims.

What is claimed is:

1. An AFC system for a synthesizer-tuned television receiver comprising:
   voltage-controllable reference oscillator; voltage applying means coupled between the tuning control terminal of reference oscillator and between at least a first and a second source of tuning voltage, and a means for selecting the source of tuning voltage applied to the tuning control terminal;
   a crystal-controlled oscillator;
   a control circuit having an input coupled to the crystal-controlled oscillator and an output coupled to the reference oscillator;
   an AFC switch coupled to the control circuit, the AFC switch having an OFF condition and an ON condition whereby when the AFC switch is in the OFF condition the reference oscillator is continuously coupled by the control circuit to the crystal-controlled oscillator so that the reference oscillator is injection locked to the crystal-controlled oscillator and frequency of its output signal is equal to the frequency of the crystal-controlled oscillator; and
   an acquisition delay circuit having an input coupled to the voltage applying means and an output coupled to the control circuit so that when a source of tuning voltage is selected the reference oscillator is, for a period of time determined by the acquisition delay circuit, injection locked to the crystal-controlled oscillator and subsequently controlled by the voltage applied to the tuning control terminal through the voltage applying means.

2. A system as defined in claim 1 wherein the applying means comprises a FINE TUNE switch having an OFF condition and an ON condition.

3. A system as defined in claim 2 wherein the FINE TUNE switch is so arranged and constructed as to couple, when in its ON condition, the reference oscillator tuning control terminal to a source of manually variable fine tuning voltage.

4. A system as defined in claim 3 wherein the source of manually variable fine tuning voltage comprises a potentiometer connected between first and second reference potentials.

5. A system as defined in either claim 2 or claim 3 wherein the FINE TUNE switch is so arranged and constructed as to couple, when in its OFF condition, the reference oscillator tuning control terminal to a source of AFC control voltage derived from an AFC detector.

6. A system as defined in claim 5 further comprising a control voltage clamp coupled to the source of AFC voltage for clamping the voltage applied to the tuning control terminal to an AFC reference voltage during acquisition time of the synthesizer's phase-locked loop.

7. A system as defined in claim 5 further comprising diode means coupled to the source of AFC control voltage for restricting the voltage applied to the tuning control terminal between an upper and a lower limit, thereby limiting the AFC pull-in range.

8. A system as defined in claim 6 further comprising diode means coupled to the source of AFC control voltage and to the control voltage clamp for restricting the voltage applied to the tuning control terminal between an upper and a lower limit, thereby limiting the AFC pull-in range.

9. A system as defined in claim 1 wherein the reference oscillator comprises an inductance in the form of a secondary winding of a transformer, the primary of which is connected to the output of the control circuit so that the crystal-controlled oscillator is selectively magnetically coupled to the reference-oscillator.

10. A system as defined in claim 9 wherein the tank circuit further comprises a voltage-controllable capacitance coupled to the inductance and to the voltage applying means.

11. A system as defined in claim 10 wherein the voltage-controllable capacitance is a varactor diode connected in series with the inductance.

12. A system as defined in claim 1 wherein the control circuit comprises:
   a logic circuit so constructed that its output is at a logic ZERO level whenever an input is at a logic ONE level and at a logic ONE level when all inputs are at a logic ZERO level, and
   an analog gate coupled between the crystal-controlled oscillator and the reference oscillator and responsive to the output of the logic circuit so that when the output of the logic circuit is a logic ZERO level the crystal-controlled oscillator is coupled to the reference oscillator.

13. A system as defined in claim 12 wherein the logic circuit has an input coupled to a logic ONE level when the AFC switch is in its ON condition and coupled to a logic level ZERO when the AFC switch is in its OFF condition.

14. A sytem as defined in either claim 12 or 13 wherein the logic circuit has an input coupled to a logic ONE level when the receiver is operating on a UHF channel and coupled to a logic ZERO level when the receiver is operating on a VHF channel.

15. A reference oscillator for a frequency synthesizer, said oscillator comprising:
    a crystal-controlled oscillator;
    a voltage-controllable oscillator selectively coupled to the crystal-controlled oscillator and having a voltage control terminal at which is applied a voltage for determining the natural frequency of operation of the voltage controllable oscillator;
    first switching means having a pole coupled to the voltage control terminal;
    a fine tuning circuit coupled to one terminal of the first switching means;
    an AFC control circuit coupled to another terminal of the first switching means;
    a control circuit having an input coupled to the crystal-controlled oscillator and an output coupled to the voltage-controllable oscillator;
    second switching means having a pole coupled to the control circuit and a first terminal corresponding to an AFC OFF condition and a second terminal corresponding to an AFC ON condition so that when the second switching means is in the AFC OFF condition the voltage-controllable oscillator is injection locked to the crystal controlled oscillator and when the second switching means is in the AFC ON condition the operating frequency of the reference oscillator is determined by the voltage applied to the voltage control terminal of the voltage-controllable oscillator.

16. A reference oscillator as defined in claim 15 wherein the second switching means is an AFC switch comprising:
    first and second poles, each coupled to a potential voltage;
    first and second OFF terminals associated with a respective pole, the first OFF terminal coupled to the AFC control circuit so that when the AFC switch is in the OFF condition the voltage at the tuning control terminal is clamped at a predetermined value, the second OFF terminal coupled to the control circuit so that when the AFC switch is in the OFF condition the voltage controllable oscillator is coupled to the crystal-controlled oscillator.

* * * * *